(12) United States Patent
Rouis

(10) Patent No.: US 8,117,484 B2
(45) Date of Patent: Feb. 14, 2012

(54) METHOD AND DEVICE FOR GENERATION OF OUT-OF-PHASE BINARY SIGNALS, AND USE OF THE SAME

(75) Inventor: Oussama Rouis, Levallois Perret (FR)

(73) Assignee: Valeo Equipements Electriques Moteur, Creteil (FR)

( * ) Notice: Subject to any disclaimer, the term of this patent is extended or adjusted under 35 U.S.C. 154(b) by 646 days.

(21) Appl. No.: 12/280,633

(22) PCT Filed: Apr. 26, 2007

(86) PCT No.: PCT/FR2007/051180
§ 371 (c)(1),
(2), (4) Date: Nov. 5, 2008

(87) PCT Pub. No.: WO2007/138202
PCT Pub. Date: Dec. 6, 2007

(65) Prior Publication Data
US 2009/0310727 A1    Dec. 17, 2009

(30) Foreign Application Priority Data
May 31, 2006    (FR) ...................................... 06 51965

(51) Int. Cl.
*G06F 1/08* (2006.01)
(52) U.S. Cl. ...................................................... 713/501
(58) Field of Classification Search .................. 327/149; 713/500–503; 318/400.13, 779, 599
See application file for complete search history.

(56) References Cited

U.S. PATENT DOCUMENTS

| | | | |
|---|---|---|---|
| 3,921,079 A * | 11/1975 | Heffner et al. | 327/242 |
| 4,951,628 A | 8/1990 | Matsuoka et al. | |
| 5,144,929 A | 9/1992 | Hosoya et al. | |
| 5,186,144 A | 2/1993 | Fukui | |
| 5,218,314 A * | 6/1993 | Efendovich et al. | 327/152 |
| 5,303,365 A * | 4/1994 | Getzlaff et al. | 713/500 |
| 5,325,026 A * | 6/1994 | Lyons et al. | 318/400.04 |
| 5,574,756 A * | 11/1996 | Jeong | 375/376 |
| 5,737,589 A * | 4/1998 | Doi et al. | 713/503 |
| 6,009,534 A * | 12/1999 | Chiu et al. | 713/503 |
| 6,247,138 B1 * | 6/2001 | Tamura et al. | 713/600 |
| 6,380,774 B2 * | 4/2002 | Saeki | 327/119 |
| 6,424,592 B1 * | 7/2002 | Maruyama | 365/233.1 |
| 6,812,667 B2 * | 11/2004 | Yasohara et al. | 318/599 |
| 6,909,312 B2 * | 6/2005 | Mitsumoto | 327/141 |
| 7,116,746 B2 * | 10/2006 | Nagano | 375/373 |
| 7,174,475 B2 * | 2/2007 | Lee et al. | 713/503 |
| 7,259,531 B1 * | 8/2007 | Liu | 318/400.38 |
| 7,403,584 B2 * | 7/2008 | Koenenkamp | 375/371 |

FOREIGN PATENT DOCUMENTS

| | | |
|---|---|---|
| DE | 39 33 987 A1 | 4/1990 |
| DE | 41 28 909 A1 | 3/1992 |

* cited by examiner

*Primary Examiner* — Paul R Myers
(74) *Attorney, Agent, or Firm* — Berenato & White, LLC

(57) ABSTRACT

A method for the generation of binary signals (So1, So2, So3) which are out-of-phase with a control phase angle (?) which is continuously variable in relation to at least one synchronisation binary signal from a set of synchronisation binary signals (Si1, Si2, Si3) which have the same variable period, such as those creating rising and falling fronts of the out-of-phase signals (So1, So2, So3) by calculating at least one level switching time at least from rising or falling synchronisation fronts of the synchronisation binary signal (Si1, Si2, Si3) at least according to the control phase angle (?). According to the invention, at least one reference front is selected from the synchronisation fronts such that the time is as short as possible.

10 Claims, 9 Drawing Sheets

METHOD AND DEVICE FOR GENERATION OF OUT-OF-PHASE BINARY SIGNALS, AND USE OF THE SAME

CROSS-REFERENCE TO RELATED APPLICATIONS AND CLAIM TO PRIORITY

This application relates to International Application No. PCT/FR2007/051180 filed Apr. 26, 2007 and French Patent Application No. 0651965 filed May 31, 2006, of which the disclosures are incorporated herein by reference and to which priority is claimed.

TECHNICAL FIELD OF THE INVENTION

The present invention concerns a method and device for generating binary signals having a phase difference based on a programmable component.

TECHNOLOGICAL BACKGROUND OF THE INVENTION

Phase-shifting circuits are used in many applications in electronics, both in signal processing and in power electronics. In general, a circuit is designed to produce a given phase difference at a given frequency. The circuit must be modified for another phase angle or another frequency.

The circuits and methods described in the document U.S. Pat. No. 6,744,296 changed this situation since the phase-offset angle can be continuously adjusted by a voltage independently of the frequency.

However, the analogue components used partly in the above circuits do not guarantee the generation of very precise phase differences required by certain applications.

This is the case in particular in automotive applications, such as electronic ignition, or the control of brushless electrical motors/generators.

The document U.S. Pat. No. 4,788,957, for example, therefore proposes to improve the devices for controlling the ignition point of internal combustion engines by using a phase-difference circuit and an auto-ignition detector formed by a computer.

One obstacle to making fully digital methods in the field more widespread, although they are advantageous with regard to flexibility of implementation and cost compared with analogue methods, has been the great calculation power necessary for following the rapid variations in the signals.

The appearance on the market of multiprocessor microcontroller components dispenses with this constraint provided that they are programmed appropriately.

The document U.S. Pat. No. 5,317,248 discloses precisely a way of programming an MC68332 microcontroller from Motorola in order to generate control pulses, width modulated, for polyphase electrical machines.

The MC68332 microcontroller also has a central processing unit, or CPU (CPU is the English acronym for Central Processing Unit), a calculation unit dedicated to temporal events, or TPU (TPU is the English acronym for Time Processor Unit). The TPU has programmable delay circuits (known to persons skilled in the art by the English term "timer") and programmable pulse width modulation modules, referred to as PWM modules (PWM is the English acronym for Pulse Width Modulation).

The TPU generates a synchronisation signal and pulses centered on the edges of this signal.

The algorithms described in the document U.S. Pat. No. 5,317,248 to delimit transit times and jitter but the method used seems to be applicable only in the case where the signals generated are out of phase only with respect to a single synchronisation signal, coming from a single sensor sensing the position of the rotor of the machine.

However, it is known that it is preferable for a polyphase electrical machine to comprise one position sensor for each phase in order to quickly detect variations in the speed of the rotor.

GENERAL DESCRIPTION OF THE INVENTION

The present invention therefore aims to fill this gap by providing a method of generating binary signals out of phase with a respect to at least one synchronisation binary signal in a set of synchronisation binary signals. The control phase-offset angle is continuously variable and the synchronisation signals have the same variable period.

This method is of the type consisting of producing the rising and falling edges of the out-of-phase signals by calculating at least one level-switching delay from the synchronisation edges, rising or falling, of the synchronisation binary signal at least, according to at least the control phase-difference angle.

The method according to the invention is remarkable in that at least one reference edge is chosen among the synchronisation edges such that this level-switching delay is minimum.

Preferably, the number of out-of-phase signals and the number of synchronisation signals are equal to a predetermined number of phases. The synchronisation signals advantageously have a duty cycle ratio of 0.5 and are out of phase with each other by a nominal phase-difference angle in degrees equal to 360° divided by this number of phases. An additional characteristic of the method according to the invention therefore consists of measuring an interval of time lying between two successive synchronisation edges, one being rising and the other falling.

The level-switching delay is calculated for a current synchronisation binary signal among the synchronisation binary signals with a view to producing the corresponding edge of the associated current out-of-phase binary signal, preferably by the following expression:

$$\Delta T1 = \Delta Tpn^*(\Delta\varphi ref - \varphi + 180)^* Np/360$$

where:
  $\Delta Tpn$ is the interval of time measured previously;
  $\varphi$ is the control phase angle expressed in degrees;
  $\Delta\varphi$ ref is the phase difference $\varphi 0 - \varphi r$, expressed in degrees, between an initial edge of initial phase angle $\varphi 0$ of the current synchronisation binary signal and the reference edge of reference phase angle $\varphi r$ of a reference synchronisation binary signal chosen from the synchronisation signals;
  Np is equal to twice the number of phases.

Advantage is taken of the fact that an inter-edge value of the time interval lying between two successive synchronisation edges results from a counting by means of a programmable measuring delay circuit, having a predetermined measurement incrementation frequency, which is associated with the synchronisation binary signals.

In this case, a current value of the level-switching delay is calculated for a current synchronization binary signal among the synchronization binary signals, with a view to producing the corresponding edge of the associated current out-of-phase binary signal, preferentially by the following expression:

$$V\Delta T1 = V\Delta Tpn^*(\Delta\varphi ref - \varphi + 180)^* Np/360$$

where:

V∆Tpn is the inter-edge value;

φ is the control phase angle expressed in degrees;

∆φref is the phase difference φ0−φr, expressed in degrees, between an initial edge of initial phase angle φ0 of the current binary synchronisation signal and the reference edge of reference phase angle φr of a reference binary synchronisation signal chosen from the binary synchronisation signals;

Np is equal to twice the number of phases.

At this stage, the method of generating out-of-phase binary signals according to the invention highly advantageously comprises the following steps:

the current incrementation frequency of a current programmable delay circuit associated with the current binary synchronisation signal is made equal to the measurement incrementation frequency;

a current output line is associated with the current programmable delay circuit;

the current value V∆T1 or the switching delay is loaded into the current programmable delay circuit;

this current programmable delay circuit is configured so that the current output line makes a first transition from a high level to a low level, or a second transition from a low level to a high level, when a current counter of the current programmable delay circuit reaches the current value V∆T1;

the current out-of-phase binary signal is generated by means of the current output line.

Alternatively to the above steps, the method of generating out-of-phase binary signals according to the invention also advantageously comprises in a variant the following steps:

the current incrementation frequency of a current programmable delay circuit associated with the current binary synchronisation signal is made equal to the measurement incrementation frequency;

the current value V∆T1 of the switching delay is loaded into the current programmable delay circuit;

a current interruption associated with the current programmable delay circuit is activated, occurring on each occasion that the current value V∆T1 is reached;

the current counting frequency of a current programmable counter of a current programmable pulse width modulation module is made equal to the measurement incrementation frequency divided by twice the number of phases;

a current output line is associated with the current programmable pulse width modulation module;

a current period register and a current duty cycle register of the current programmable pulse width modulation module are loaded respectively with the inter-edge value V∆Tpm and with half this value;

the current programmable pulse width modulation module is configured so that the current output line undergoes an initial transition from a high level to a low level and then a first transition from a low level to a high level when the current programmable counter reaches a current intermediate value contained in the current duty cycle register, and finally a second transition from a high level to a low level when the current programmable counter reaches a current final value contained in the current period register at each triggering of the current interruption;

the current out-of-phase binary signal is generated by means of the current output line.

The invention also concerns a device for generating binary signals out-of-phase by a control phase-difference angle continuously variable with respect to at least one binary synchronisation signal in a set of binary synchronisation signals, of the type comprising a microprocessor or a microcontroller comprising:

at least one central processing unit;

at least one volatile memory and/or at least one non-volatile memory;

at least one programmable delay circuit;

at least one input port.

The memories of this device are distinguished from the prior art by the fact that they contain a program implementing the method according to the invention.

In a variant, the device also preferably comprises at least one programmable pulse width modulation module.

The device also advantageously comprises a serial interface receiving a signal representing the control phase angle. This interface preferably provides a connection with an embedded system of the CAN type.

Benefit will be derived from the use of the method and/or device according to the invention in the control loop of a polyphase electrical machine on board a vehicle, in particular a motor car.

It goes without saying that the invention also concerns the sequences of instructions that can be executed by the device described above and implementing the previously disclosed method.

These few essential specifications will have made obvious to a person skilled in the art the advantages afforded by the method and device for generating out-of-phase signals, according to the invention, compared with the prior art.

The detailed specifications of the invention are given in the following description in relation to the accompanying drawings. It should be noted that these drawings have no other purpose than to illustrate the text of the description and in no way constitute a limitation to the scope of the invention.

BRIEF DESCRIPTION OF THE DRAWINGS

FIG. 7 shows the principle of the generation of a binary signal by means of a programmable counter of this module.

FIG. 8 shows the principle of the generation of a binary signal out-of-phase with respect to a synchronisation binary signal.

FIG. 9 illustrates the reconstruction of a current out-of-phase binary signal from three synchronisation signals.

DESCRIPTION OF PREFERRED EMBODIMENTS OF THE INVENTION

The method according to the invention makes it possible to regenerate, from a number N of input signals, out-of-phase with each other by a constant nominal phase-difference angle φ, the same number of signals having the same phase difference φ between them, but with a programmable offset φ with respect to the input signals.

Figure 1:
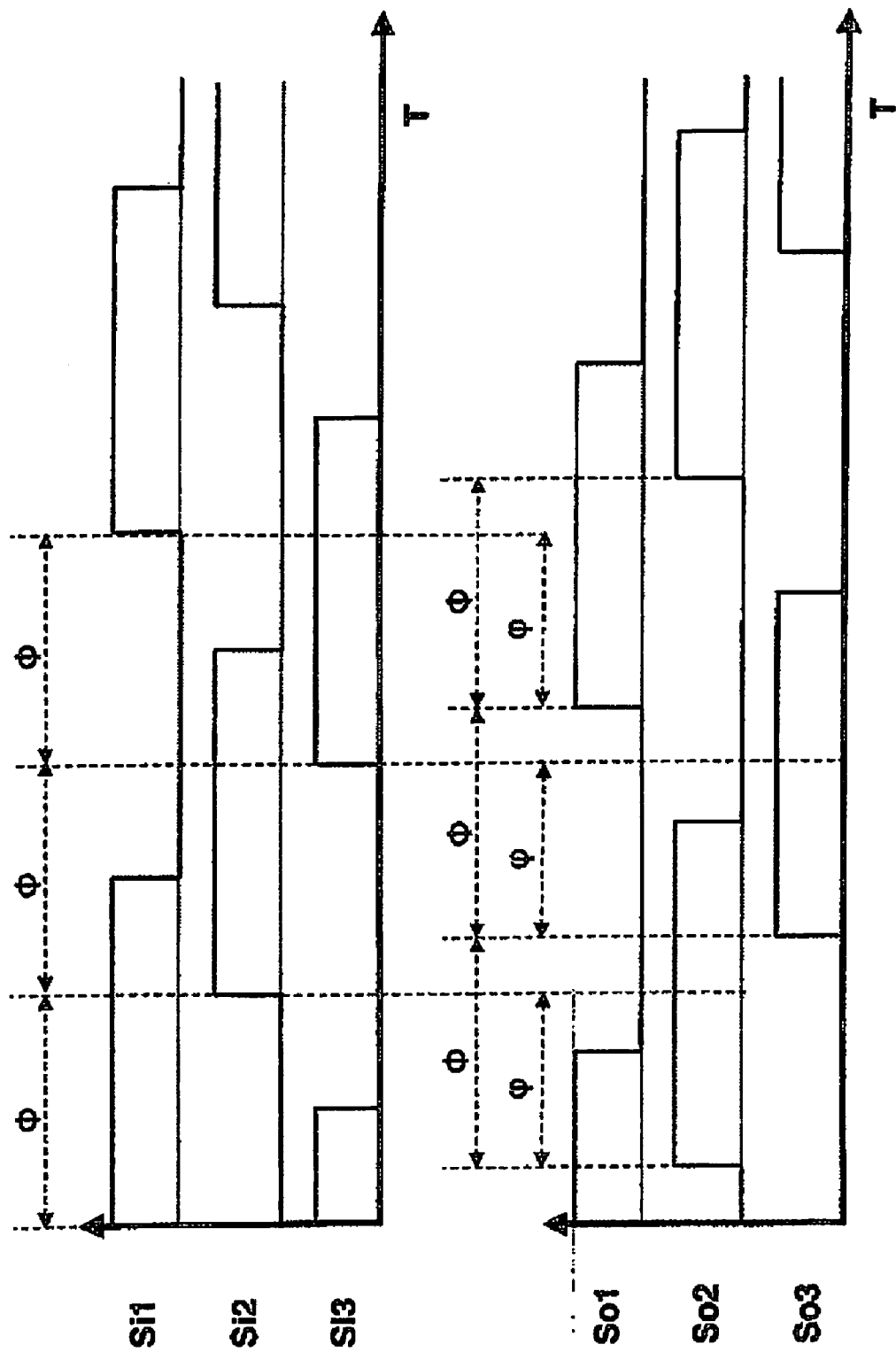
FIG. 1 shows timing diagrams for synchronisation binary signals and out-of-phase binary signals, in the case where the number of phases is equal to three.

FIG. 1 illustrates the case where N=3. The input signals Si1, Si2, Si3 are for example synchronisation binary signals issuing from the three sensors for the position of the rotor of a three-phase electrical machine. These signals Si1, Si2, Si3 have the same frequency, have a duty cycle ratio of 0.5 and are out-of-phase with each other by φ=120°.

The three out-of-phase binary signals So1, So2, So3 have the same frequency and the same duty cycle ratio as the synchronisation signals Si1, Si2, Si3, they have between them a phase difference φ=120°, but there exists a phase difference φ between Si1 and So1, Si2 and So2, Si3 and So3.

The regeneration of the offset signals is based on two combined sub-functions; reconstruction and shifting. The details of these two sub-functions are given below in relation to FIGS. 2 to 6 when the regeneration uses programmable delay circuits, and in addition with FIGS. 7, 8 and 9 when the regeneration uses PWM modules.

The reconstruction of the out-of-phase binary signals So1, So2, So3 is dependent on the precise measurement of the period of the synchronisation binary signals Si1, Si2, Si3.

Figure 2:
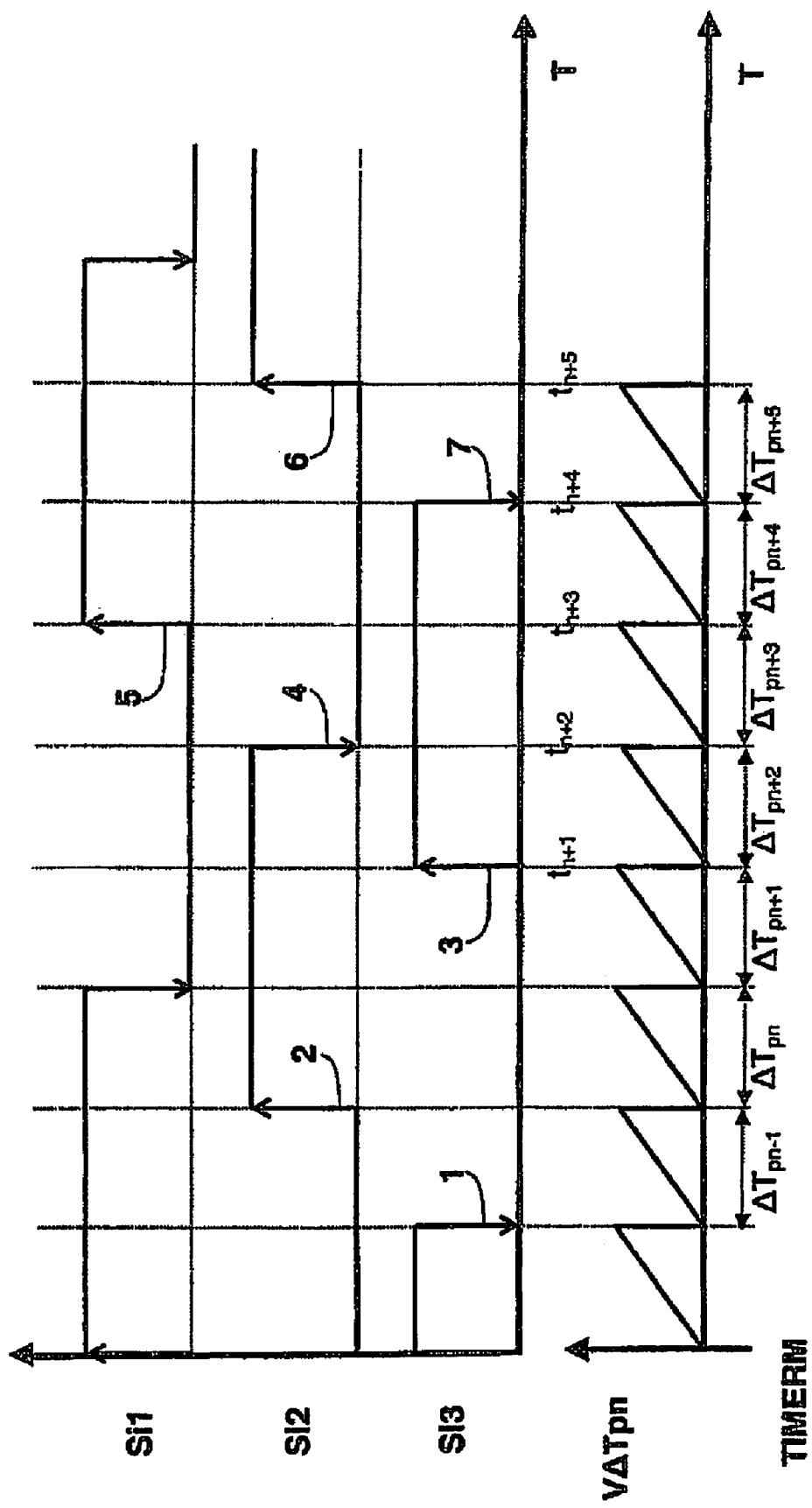
FIG. 2 illustrates the principle of the valuation of the inter-edge value V∆Tpn by means of a programmable measuring delay circuit.
Figure 3:
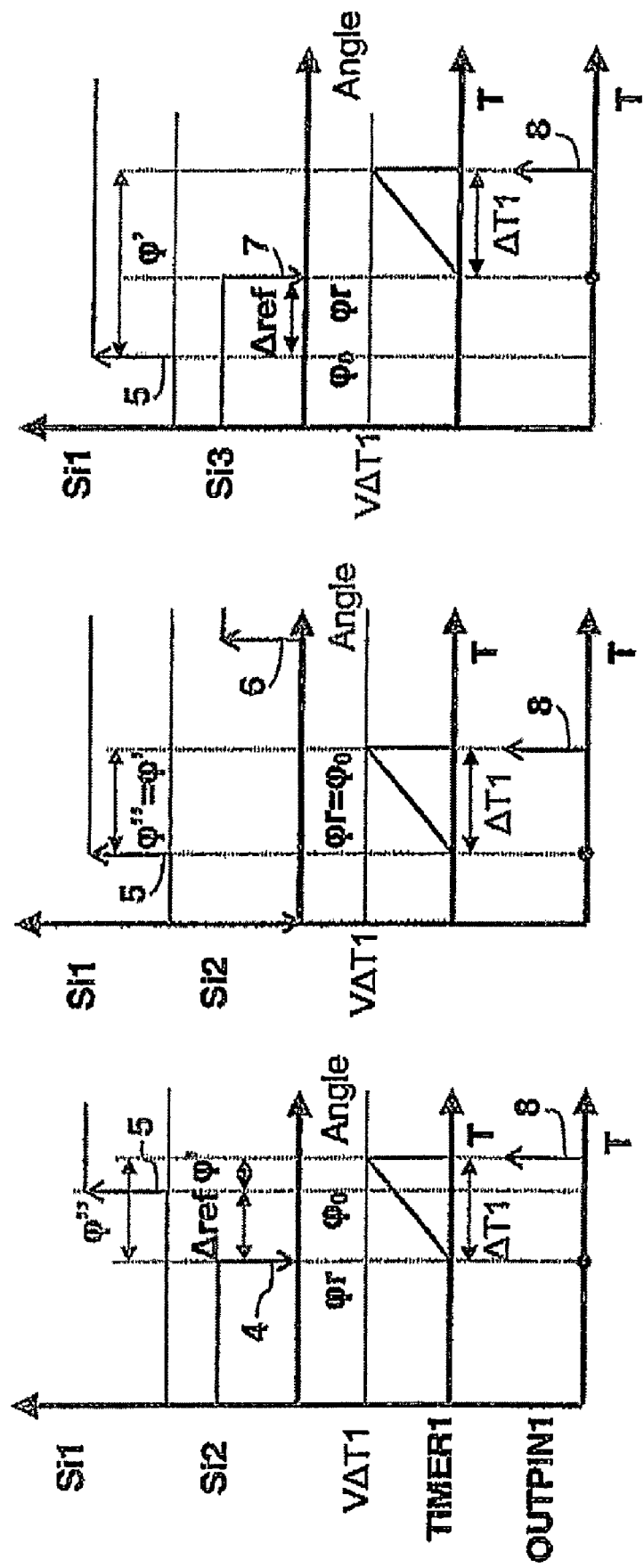
FIGS. 3a, 3b and 3c show examples of phase difference ∆φref between an initial edge of a current synchronisation binary signal and a reference edge of a reference synchronisation binary signal.

To do this, taking account of the fact that one is preferably restricted to N input signals having a duty cycle ratio of 0.5 and that are out-of-phase with each other by a nominal phase angle φ=360/N, it suffices to measure a time interval ΔTpn between two successive edges, falling and then rising 1, 2; 4, 5; 7, 6, or rising and then falling 3, 4, by a programmable delay circuit TIMERM the measurement incrementation frequency FTIMERM of which is predetermined, as shown in FIG. 2.

The value in time units of the timer of the time interval ΔTpn, that is to say the result VΔTpn of the counting by the timer TIMERM, is:

$$V\Delta Tpn = \Delta Tpn * FTIMER$$

The period ΔTtotal of the synchronisation signals Si1, Si2, Si3 is then, at time Tn:

$$V\Delta Ttotal = Np * \Delta Tpn$$

or, in the unit of time of the timer TIMERM:

$$V\Delta Ttotal = Np * V\Delta Tpn$$

Np being the number of edges per electrical period of the signals Si1, Si2, Si3, that is to say Np=2*N.

This value, loaded into the register of a programmable delay circuit associated with each of the out-of-phase signals So1, So2, So3, would, in a known manner, make it possible to regenerate pulses having a period identical to that of the input synchronisation signals Si1, Si2, Si3.

However, this elementary method is not used since it would lead to significant transit delays, and strong jitter, which would limit the application of the method to low-frequency synchronisation signals Si1, Si2, Si3.

Only the inter-edge value VΔTpn at time tn is used to produce the rising and falling edges of the out-of-phase binary signals So1, So2, So3, taking account in addition of the out-of-phase set value φ, as explained in relation to FIGS. 3a, 3b and 3c.

With the synchronisation signal Si1 there is associated a programmable delay circuit TIMER1 having the following characteristics:
  the delay circuit TIMER1 is added to a physical output line OUTPIN1 in "output compare" mode (that is to say the circuit continuously compares the value of its counting with a reference value and according to the result executes pre-programmed instructions);
  the level of the future transition H->L or L->H after a delay ΔT1 is programmed (by convention H designates a logic high level and L a logic low level, the initials of "high" and "low" in English);
  it is possible to force the transition at any time before the end of the programmed period.

The same description applies to the programmable delay circuits associated with the other synchronisation signals Si1, Si2, Si3. (It will be agreed hereinafter that the references to the signals Si1, or So1 applied to a "current" synchronisation binary signal or a "current" out-of-phase binary signal, that is to say respectively any one of the synchronisation binary signals Si1, Si2, Si3 or out-of-phase binary signals So1, So2, So3).

This configuration makes it possible to avoid the use of interrupts and therefore optimises the CPU load since the level transitions on TIMER1 will be managed by the component at the end of the programmed period.

Alternatively, according to requirements, the programmable delay circuit TIMER1 is configured in "interrupt" mode.

In the latter operating mode, the interrupt associated with TIMER1 calls an interrupt routine after a delay ΔT1: the level transition H->L or L->H then takes place directly by access to the state register of the output line OUTPIN1 associated with TIMER1. Direct access to OUTPIN1 is possible at any time in order to force the desired level.

The operating of mode of the current timer TIMER1 having been programmed, its time base is configured so that the current incrementation frequency FTIMER1 is equal to the measurement incrementation frequency FTIMERM of the timer TIMERM used for measuring the period of the signals Si1, Si2, Si3.

The generation of the out-of-phase binary signal So1 depends on the following steps:
  the inter-edge value VΔTpn is acquired at time tn;
  a scale from 0° to 360° is considered, representing the delay φ' between Si1 and the signal to be created So1 such that φ'=180°−φ;
  for each edge 1-7 of Si1, Si2 and Si3, VΔT1 is calculated, the value to be loaded into TIMER1 for creating a delay ΔT1 as a function of ΔTpn and the delay
  by means of macro-instructions CLEAR_NEXT_T1 or SET_NEXT_T1, the timer TIMER1 is configured for a transition from a high level to a low level, or for a transition from a low level to a high level respectively.

The transition takes place when the counter TIMER1 reaches the current value VΔT1 loaded into its comparison register. The current value VΔT1 corresponds to the delay ΔT1 to be produced with respect to the reference edge and Aφref is the difference in phase angle between the initial edge 5 of initial phase angle φ₀ and the reference edges 4, 5, 7 of the reference phase angle φr.

The current value VΔT1 of the delay ΔT1 is calculated as follows:

$$\Delta\phi \text{ref} = \phi_0 - \phi r$$

$$\phi' = 180 - \phi$$

$$\phi'' = \phi' + \Delta\phi \text{ref}$$

$$V\Delta T1 = V\Delta Tpn^*((\phi''^*N_p)/360).$$

FIGS. 3a, 3b and 3c show an example of the calculation of three values of Δφref for three ranges of values of φ' (the initial edge for the signal Si1 is taken as φ0=0).

In each case, the reference edge 4, 5, 7 chosen from the edges 1-7 of all the synchronisation signals Si1, Si2, Si3 preceding the edge to be reconstructed 8 of the out-of-phase binary signal So1 is the edge 4, 5, 7 closest to the transition to be obtained 8, that is to say the one for which the level-switching delay VΔT1 is minimum.

FIG. 3a shows that, for 0°<φ'<30°, the reference edge 4 is taken on the falling edge 4 of Si2. In this case:

$$\Delta \text{ref} = 0 - (-60) = 60° \text{ and}$$

$$V\Delta T1 = (V\Delta Tpn^*(\phi'+60))/60$$

FIG. 3b shows that, for 90°>φ'≧30°, the reference edge 5 and the initial edge 5 are merged with the rising edge 5 of Si1. In this case:

$$\Delta \text{ref} = 0 \text{ and } V\Delta T1 = (V\Delta Tpn^*\phi')/60$$

FIG. 3c shows that, for 150°>φ'≧90°, the reference edge 7 is taken on the falling edge of Si3. In this case:

$$\Delta \text{ref} = 0 - 60 = -60° \text{ and}$$

$$V\Delta T1 = (V\Delta Tpn^*(\phi'-60))/60$$

In general terms, the reference edges 4, 5, 7 are chosen according to φ' so as to have the minimum delay between the time tn where the measurement ΔTpn is available and the appearance of the programmed edge on the output line OUTPIN1.

Figure 4:
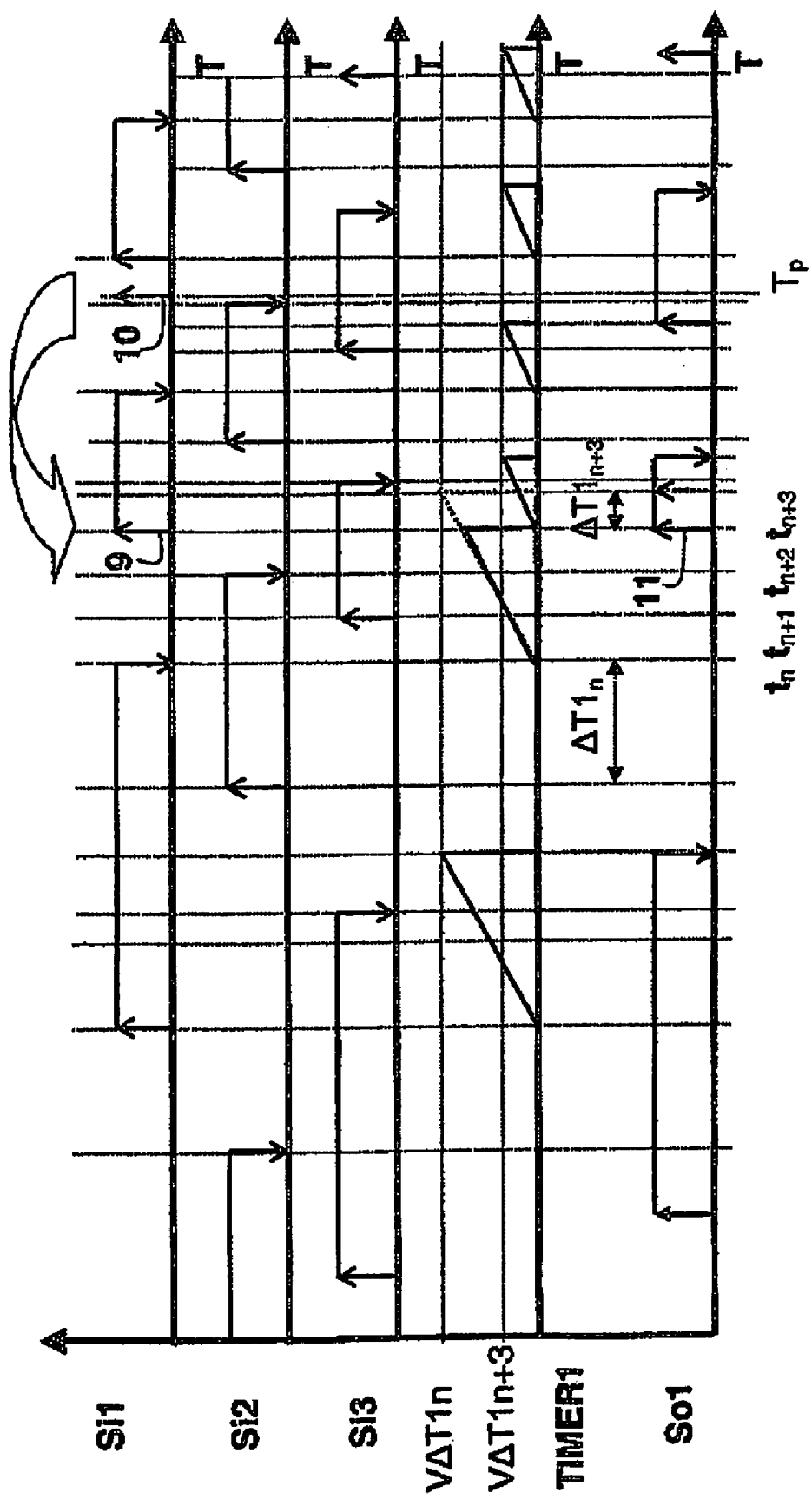
FIG. 4 illustrates the details of the method according to the invention in the case of increase in the frequency of the synchronisation signals.

When the frequency of the input signals Si1, Si2 and Si3 increases, the period ΔTpn measured decreases, the following edge 9 of Si1, Si2 or Si3 can therefore fall before the edge 10 provided at time Tp and before the end of the delay VΔT1 already programmed, as shown in FIG. 4.

In all cases, any transition programmed at a time ΔTpn is routinely forced to the time ΔTpn+1.

FIG. 4 shows clearly that the rising edge 9 of Si1 occurred at time tn+3 before the expected time Tp and before the end of the delay VΔT1n measured at time tn+3 and programmed in the timer TIMER1. The macro-instruction FORCE_TIMER1 forces the transition 11 of already programmed at time tn before recalculating the new value VΔT1n+3, which will take account of the new value of the frequency.

Figure 5:
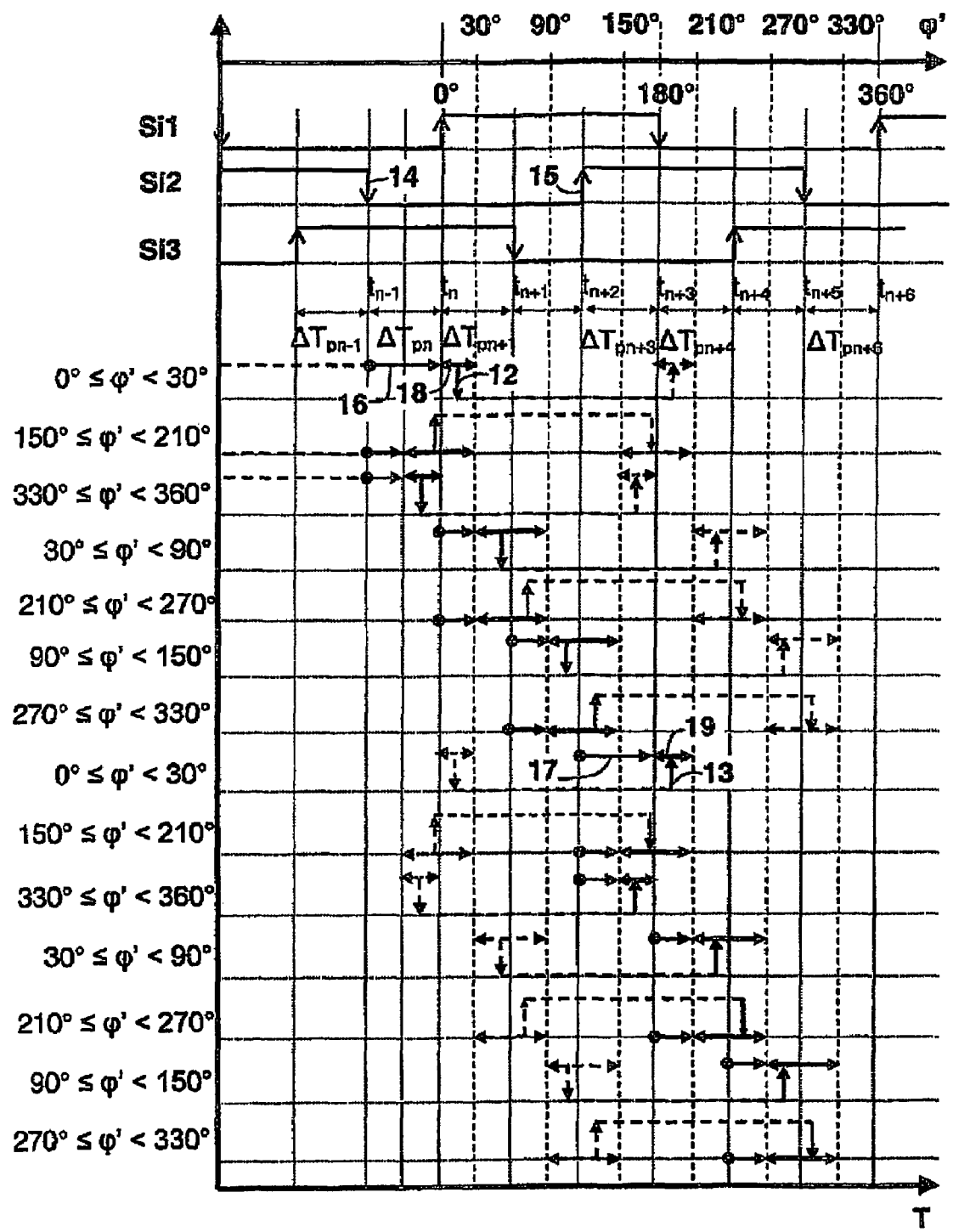
FIG. 5 shows the programming of the edges of the out-of-phase signals according to the 180° complement of the control phase-difference angle.

FIG. 5 details the steps, according to the invention, of the construction of the signal So1 on each edge of Si1, Si2 and Si3 as a function of φ'.

By convention, in this figure, in particular in the timing diagrams established in the case where the phase-difference angle φ' is between 0° and 30°, a programmed edge is represented by a vector 12, 13, its attachment to the reference edge 14, 15 is represented by another vector 16, 17, the origin of which is marked by a dot, and its latitude of variation is represented by a double arrow in bold lines 18, 19.

Figure 6:
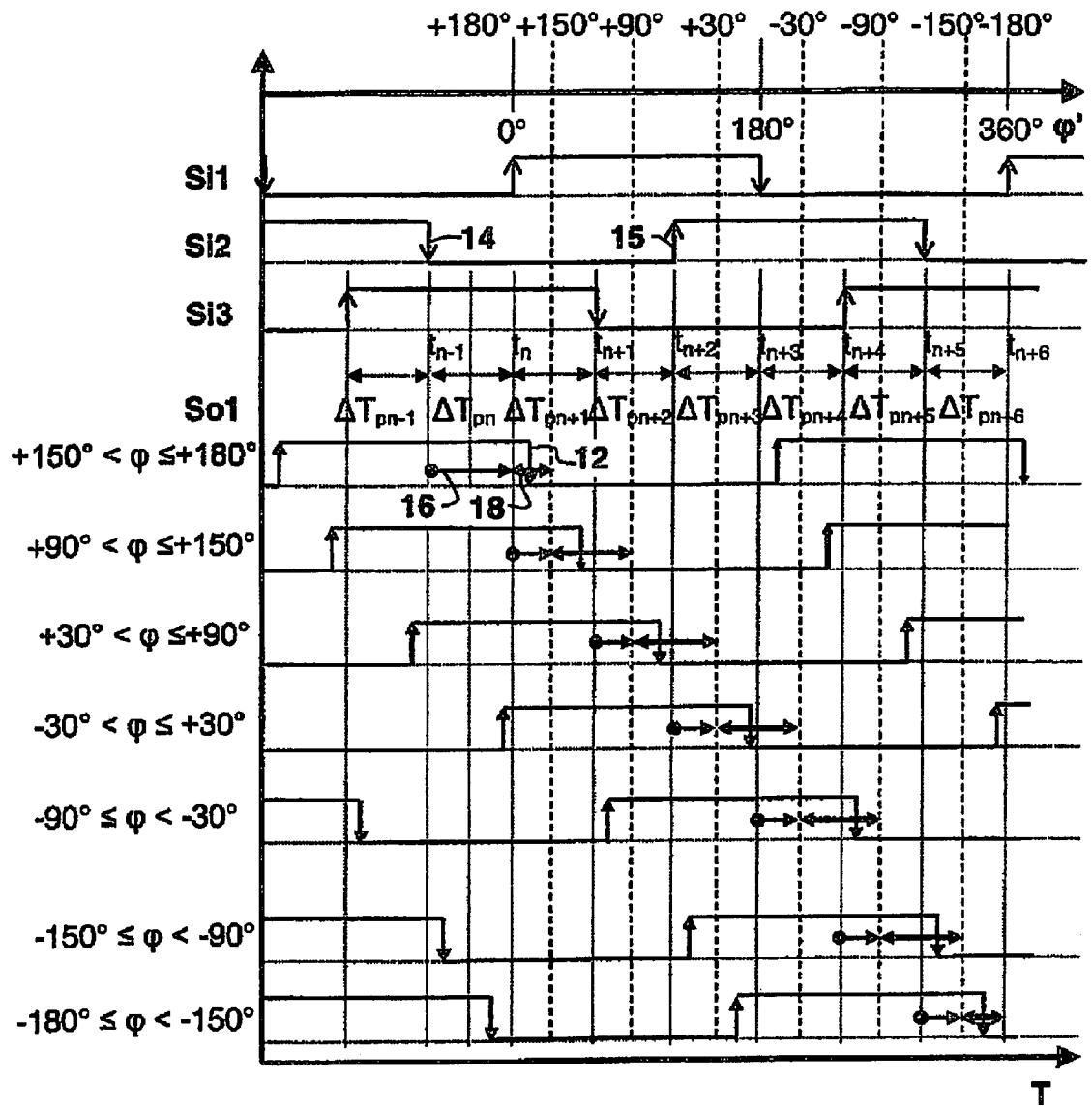
FIG. 6 shows the concatenation of the levels on the output line of a programmable delay circuit for generating an out-of-phase binary signal according to the control phase-difference angle.

The concatenation of the levels makes it possible to obtain an image signal So1 of Si1 offset by φ as shown in FIG. 6 (the convention of representing the edges is the same as in FIG. 5).

The method according to the invention applied to Si1, Si2 and Si3 in order to obtain So1 is used for generating the two signals So2 and So3:

Si2, Si3 and Si1 are respectively used for regenerating So2; Si3 and Si1 and Si2 are respectively used for regenerating So3.

According to a variant of the method according to the invention, the sub-function of reconstructing the out-of-phase binary signals So1, So2 and So3 is provided by PWM modules instead of being solely provided by the programming of programmable delay circuits TIMER1

Figure 7:
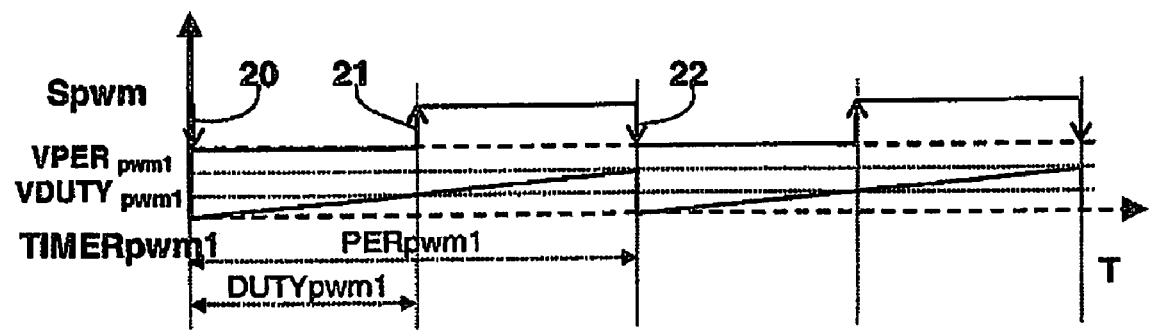
FIGS. 7, 8 and 9 illustrate a variant of the method according to the invention using a PWM module.
Figure 8:
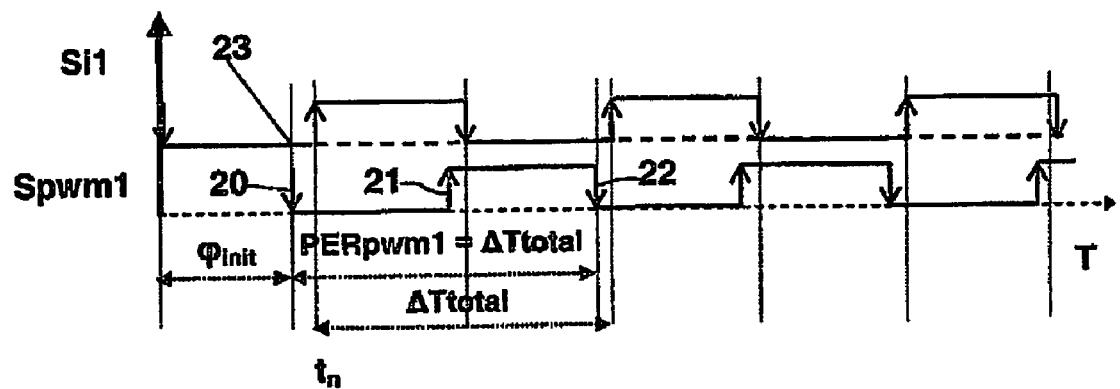
Figure 9:
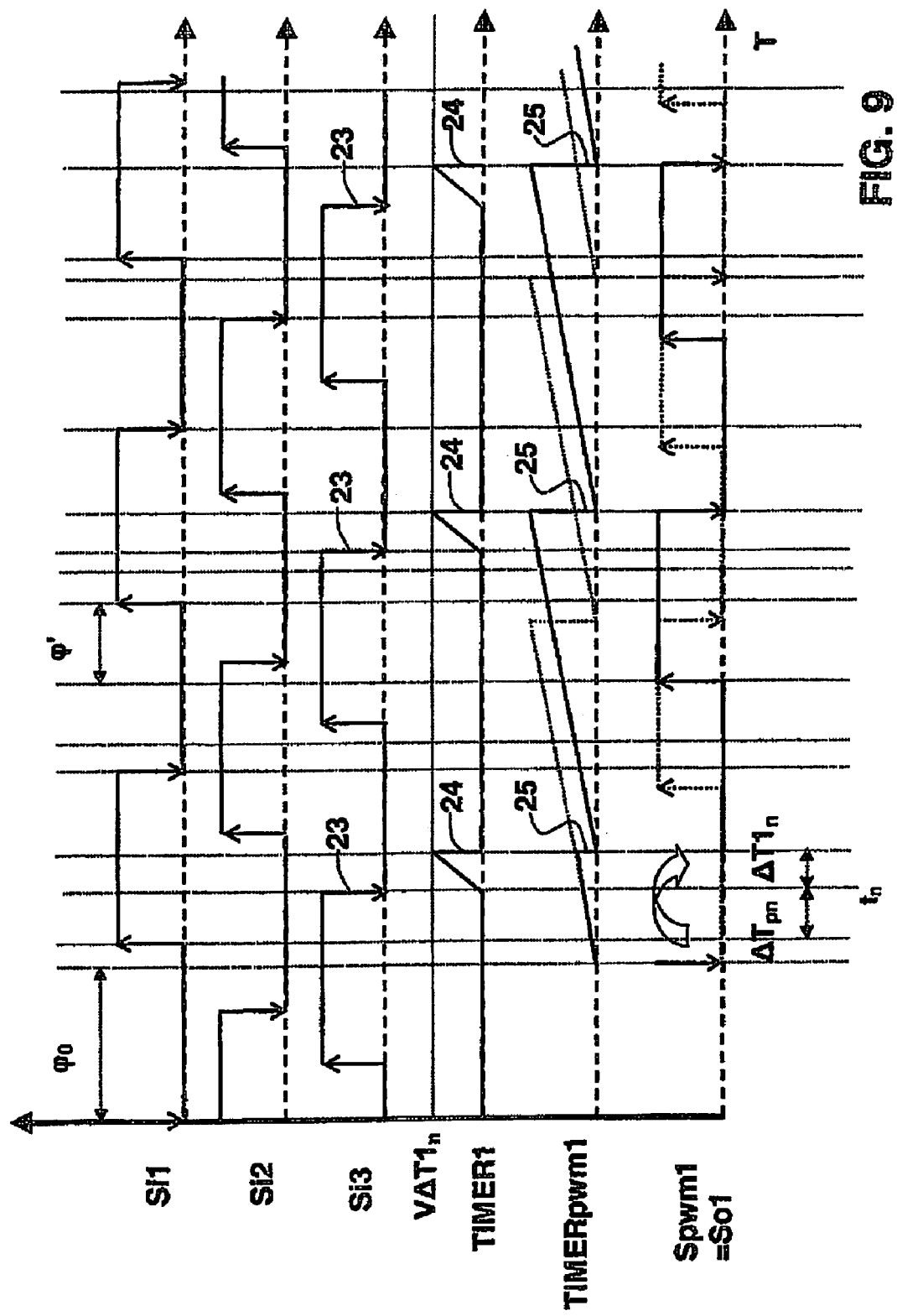

In the paragraphs that follow, a description is given of the steps through which the reconstruction of the signal So1 passes, making reference to FIGS. 7, 8 and 9 (the same steps will be adopted for generating So2 and So3):

the peripheral PWM will be configured so that it generates a signal Spwm1 as shown schematically in FIG. 7, with a falling initial edge 20;

the time base for the internal programmable counter TIMERPWM1 of the module is configured so that:

$$FPWM = FTIMERM/N_p$$

FPWM being the counting frequency in Hz of the counter TIMERpwm1 and FTIMERM being the measurement incrementation frequency in Hz of the measuring delay circuit TIMERM used for measuring the interval of time ΔTpn;

the counter TIMERPWM1 counts from 0 to the intermediate value VDUTYpwm1 programmed in the register of the duty cycle ratio REGDUTYpwm1, and, when it reaches this value, the signal Spwm1 changes state, producing a rising edge 21;

when the counter reaches the final value VPERpwm1 programmed in the configuration register for the period REGPERpwm1, the signal Spmw1 once again changes state, producing a falling edge 22;

VΔTpn is acquired, at time tn, the last inter-edge value available on each edge of the signals Si1, Si2 or Si3, the registers of the module PWM are reconfigured so that:

$$REGPERpwm1 = V\Delta Tpn$$

$$REGDUTYpwm1 = V\Delta Tpn/2$$

As shown by FIG. 8, the result is a signal Spwm1 that has the same period PERpwm1 and the same duty cycle ratio as Si1, but which is out of phase by an angle φinit that depends on the time 23 of activation of the module PWM.

The reconstruction sub-function of So1 being implemented by means of the module PWM in this variant, the determination of the offset of the signal Spwm1 is effected as in the basic method.

For each edge of Si1, Si2 and Si3, the current value VΔT1=VΔTpn*((φ''*N_p/360) is calculated and loaded into the register of the delay circuit TIMER1 in order to create a level switching delay ΔT1 according to the interval of time ΔTpn and the control phase-difference angle φ.

The interrupt INT1 associated with the timer TIMER1, which occurs at each time that the counting reaches the value VΔT1 loaded in its comparison register, triggers the call of the reconstruction routine by the module PWM, which:

deactivates the interrupt INT1 associated with TIMER1:
resets the counter TIMERpwm1 to 0;
generates a period PERpwm1 of the out-of-phase binary signal So1;
acknowledges the interrupt INT1 for a future activation.

FIG. 9 shows clearly the sequence of operations performed for regenerating the binary signal Si1 by reconstructing and offsetting the signal Spwm1.

At the end of the current value VΔT1 of the switching delay ΔT1 calculated from the appropriate reference 23 chosen on Si3, the delay circuit TIMER1 associated with Si1 stops 24.

The interrupt INT1 generated by this event at the same time triggers the reconstruction of the signal Spwm1.

The method according to the invention has been implemented on an MC9S12DG128 16-bit microcontroller target manufactured by Motorola.

Figure 10:
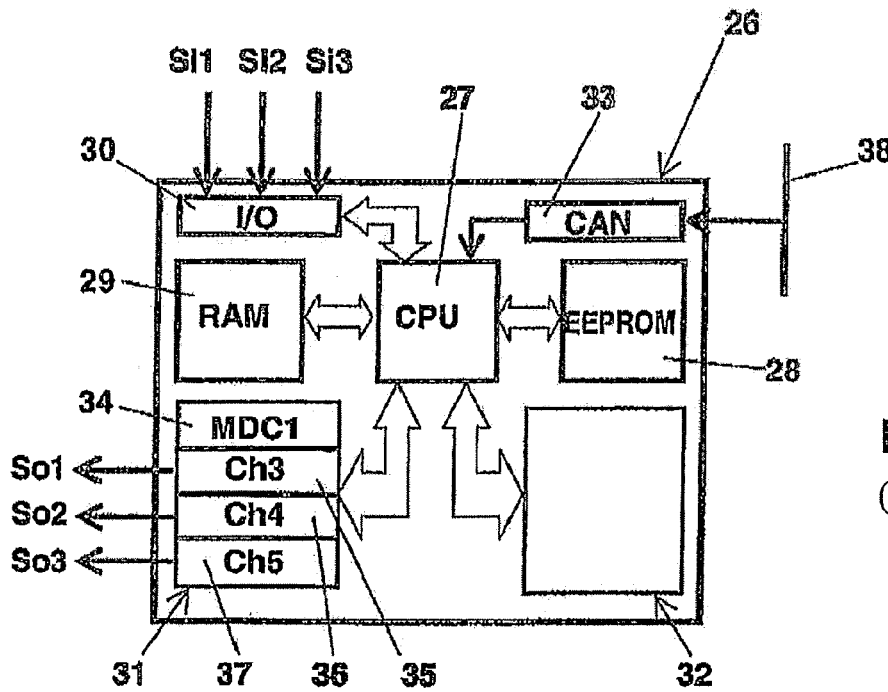
FIGS. 10 and 11 show the architecture of a microcontroller adapted to the implementation of the method according to the invention.
Figure 11:
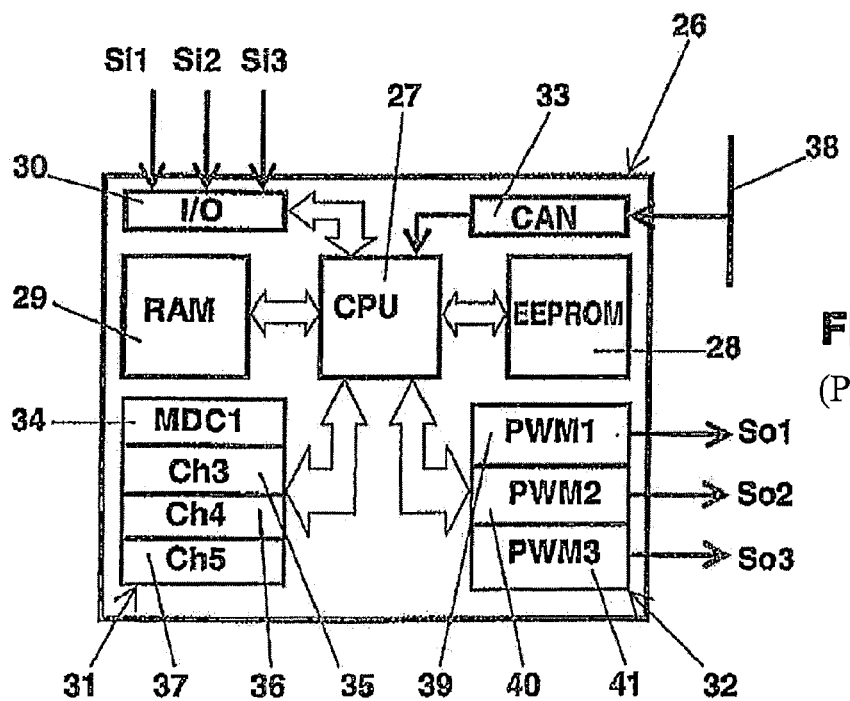

This is a component 26 whose general architecture is shown in FIGS. 10 and 11. It comprises:
- a central processing unit 27, where the internal clock frequency Fbus of the internal bus is preferably 20 MHz;
- a non-volatile memory 28 of the "flash" type, preferably 128 kilobytes;
- a RAM memory 29, preferably having a capacity of 8 kilobytes (RAM is the English acronym for "Random Access Memory", that is to say "Random Access Memory");
- an I/O port 30, the inputs of which are able to trigger interrupts on rising or falling edges, or both, according to their configuration (I/O designates inputs/outputs, input/output in English);
- an ECT peripheral 31 (ECT is the English acronym for "Enhanced Capture Timer", that is to say "Enhanced Capture Timer");
- a PWM peripheral 32;
- a CAN interface 33 (CAN is the English acronym for "Controller Area Network", that is to say "Controller Area Network");
- a JTAG interface (JTAG is the English acronym for "Joint Test Action Group", that is to say "Joint Test Action Group") for programming and debugging according to IEEE1149.1.

In the method according to the basic invention, as in its variant, the determination of the inter-edge value V$\Delta$Tpn is provided by an auxiliary down-counter 34 MDC1 (MODULUS DOWN-COUNTER) available in the ECT module and used in association with the inputs of Si1, Si2 and Si3.

For this purpose, the predivider associated with MDC1 is configured so as to have a down-counting frequency FpredMDC1 equal to that FpredPC1 of the main counter of the ECT module 31.

On each rising or falling edge of Si1, Si2 or Si3, an interrupt is generated. The difference between the maximum value 0xFFFF and the instantaneous value of the down-counter MDC1 is saved in a variable V$\Delta$Tpn before once again setting the down-counter MDC1 to 0xFFFF.

The implementation of the following steps of the method according to the invention in its basic version is based on the use of the 16-bit main counter PC1 of the ECT peripheral, and on an upstream predivider for the configuration of the incrementation frequency derived from the clock frequency.

The three channels Ch3, Ch3 and Ch5 35, 36, 37 of the main counter PC1 are used for the respective reconstruction of the signals So1, So2 and So3. The following configuration is adopted:
- the predivider of PC1 is configured to have at its output a frequency FpredPC1 =Fbus/16, that is to say preferably 1.25 MHz;
- Ch3, Ch4 and Ch5 are configured in "output compare" mode with deactivated interrupts;
- the macro-instruction CLEAR_NEXT_OUTPUT_Tn configures a future falling transition on the output (n);
- the macro-instruction SET_NEXT_OUTPUT_Tn configures a future rising transition on the output (n);
- the macro-instruction FORCE_COMPARE_Tn is used to force a rising or falling asynchronous transition on an output (n) before the initially programmed period elapses.

On each rising or falling edge of Si1, Si2 or Si3 an interrupt is generated. The signal giving rise to the interrupt (Sin among Si1, Si2 and Si3) and the nature of the transition (rising or falling) being identified by reading the state of the associated inputs, the value V$\Delta$Tn is calculated according to the offset value $\phi$ as described previously.

According to Sin and the nature of the transition, the value V$\Delta$Tn is allocated to the corresponding register TCn.

The offset value is preferably sent via the CAN bus 38 to the dedicated interface 33 of the microcontroller 26. The application receives information in 16 bits lying between 0 and 3600 corresponding to the variable $\phi'$ and applies a real offset $\phi$ of between $-180°$ and $180°$.

The implementation of the variant of the method according to the invention using the PWM peripheral 32 of the microcontroller 26 is effected by the programming, without any particular difficulty, of the corresponding algorithms on three 39, 40, 41 of the eight PMW channels available.

The method and device described above are used in particular for generating control signals for a reversible polyphase electrical machine, referred to as an alternator starter, for a motor vehicle with thermal engine.

Another field of use, where the reduction in the transit times and jitter resulting from the method and device according to the invention constitutes an advantage, is naturally that of electronic ignition that requires the generation of ignition pulses following a delay curve for the ignition in a manner that is all the more precise, the faster the rise in speed of the engine.

The implementation of the method according to the invention on a particular type of microcontroller 26, being limited to three signals Si1, Si2, Si3, is given only by way example. A person skilled in the art will without difficulty apply the algorithms described to other programmable components such as microprocessors associated with memories, or FPGAs (FPGA is the English acronym for "Field Programmable Gate Array" that is to say "Field Programmable Gate Array") for any number of phases.

As goes without saying, the invention is not limited solely to the preferential embodiments described above. On the contrary it embraces all possible variant embodiments within the limit of the object of the following claims.

The invention claimed is:

1. A method for generating binary signals (So1, So2, So3) out-of-phase by a control phase-difference angle ($\phi$) continuously variable with respect to at least one synchronization binary signal of a set of synchronization binary signals (Si1, Si2, Si3) having the same variable period ($\Delta$Ttotal), comprising the steps of:
   producing rising (8) and falling (12) edges of said out-of-phase signals (So1, So2, So3) by calculating at least a level-switching delay ($\Delta$T1) from at least rising synchronization edges (2, 3, 5, 6) or falling synchronization edges (1, 4, 7) of said synchronization binary signal (Si1, Si2, Si3) according to at least said control phase-difference angle ($\phi$);
   measuring an interval of time ($\Delta$Tpn) between two of said successive synchronization edges (1-7), one being rising and the other falling;
   at least one reference edge (4, 5, 7) being chosen from said synchronization edges (1-7);
   a number of said out-of-phase signals (So1, So2, So3) and a number of said synchronization signals (Si1, Si2, Si3) being equal to a predetermined number of phases;
   said synchronization signals (Si1, Si2, Si3) having a duty cycle ratio equal to 0.5 and being out-of-phase with each other by a nominal phase-difference angle (Φ) in degrees equal to 360° divided by said number of phases; and calculating said delay (ΔT1) for a current synchronization binary signal (Si1, Si2, Si3) among said synchronization binary signals (Si1, Si2, Si3) with a view to producing the corresponding edge (8, 12) of the associated current out-of-phase binary signal (So1) by the following expression:

$$\Delta T1 = \Delta Tpn * (\Delta \phi ref - \phi + 180) * Np/360,$$

where:

ΔTpn is said interval of time;

φ is said control phase angle between −180° and +180°;

Δφref is the phase difference φ0−φr, expressed in degrees, between an initial edge of initial phase angle φ0 of said current synchronization binary signal and said reference edge (4, 5, 7) of reference phase angle φr of a reference synchronization binary signal chosen from the synchronization signals (Si1, Si2, Si3); and Np is equal to twice the number of phases.

2. The method according to claim 1, wherein an inter-edge value (VΔTpn) of said interval of time (ΔTpn) results from a counting by means of a programmable measuring delay circuit (TIMERM, 34) associated with said synchronization binary signals (Si1, Si2, Si3) having a predetermined measurement incrementation frequency (FTIMERM).

3. The method according to claim 2, further comprising the following steps:

making a current incrementation frequency (FTIMER1) of a current programmable delay circuit (TIMER1, 35, 36, 37) associated with said current binary synchronization signal (Si1) equal to said predetermined measurement incrementation frequency (FTIMERM);

associating a current output line (OUTPIN1) with said current programmable delay circuit (TIMER1, 35, 36, 37);

loading a current value (VΔT1) of said delay (ΔT1) into said current programmable delay circuit (TIMER1, 35, 36, 37);

configuring said current programmable delay circuit (TIMER1, 35, 36, 37) so that said current output line (OUTPIN1) makes a first transition from a high level to a low level, or a second transition from a low level to a high level, when a current counter of said current programmable delay circuit (TIMER1, 35, 36, 37) reaches said current value (VΔT1); and generating said current out-of-phase binary signal (So1) by means of said current output line (OUTPIN1).

4. The method according to claim 2, further comprising the following steps:

making a current incrementation frequency (FTIMER1) of a current programmable delay circuit (TIMER1, 35, 36, 37) associated with said current binary synchronization signal (Si1) equal to said predetermined measurement incrementation frequency (FTIMERM);

loading a current value (VΔT1) of said switching delay (ΔT1) into said current programmable delay circuit (TIMER1, 35, 36, 37);

activating a current interruption (INTT1) associated with said current programmable delay circuit (TIMER1, 35, 36, 37), occurring on each occasion that said current value (VΔT1) is reached;

making a current counting frequency (FPMW) of a current programmable counter (TIMERPWM1) of a current programmable pulse width modulation module (PWM1, 39, 40, 41) equal to said predetermined measurement incrementation frequency (FTIMERM) divided by twice the number of phases;

associating a current output line (Spwm1) with said current programmable pulse width modulation module (PWM1, 39, 40, 41);

loading a current period register (REGPERpwm1) and a current duty cycle register (REGDUTYpwm1) of said current programmable pulse width modulation module (PWM1, 39, 40, 41) respectively with said inter-edge value (VΔTpm) and with half said inter-edge value (VΔTpm);

configuring said current programmable pulse width modulation module (PWM1, 39, 40, 41) so that said current output line (Spwm1) undergoes an initial transition from a high level to a low level and then a first transition from a low level to a high level when said current programmable counter (TIMERPWM1) reaches a current intermediate value (VDUTYpmw1) contained in said current duty cycle register (REGDUTYpwm1), and finally a second transition from a high level to a low level when said current programmable counter (TIMERPWM1) reaches a current final value (VPERpwm1) contained in said current period register (REGPERpwm1) at each triggering of said current interruption (INIT1); and generating said current out-of-phase binary signal (So1) by means of the current output line (Spwm1).

5. A device for generating binary signals (So1, So2, So3) out of phase by a control phase-difference angle (φ) continuously variable with respect to at least one binary synchronization signal in a set of binary synchronization signals (Si1, Si2, Si3), said device comprising a microprocessor (26) comprising:

at least one central processing unit (27);

at least one of at least one volatile memory (29) and at least one non-volatile memory (28);

at least one programmable delay circuit (34, 35, 36, 37);

at least one input port (3);

said at least one non-volatile memory (28, 28) including a program implementing the method according to claim 1.

6. The device for generating out-of-phase binary signals (So1, So2, So3) according to claim 5, further comprising at least one programmable pulse width modulation module (39, 40, 41).

7. The device for generating out-of-phase binary signals (So1, So2, So3) according to claim 5, further comprising a serial interface (33) receiving a signal representing said control phase angle (φ), said interface (33) preferably providing a connection with an onboard network (38) of the CAN type.

8. Use of the method according to claim 1 in a control loop of a polyphase electrical machine installed on a motor vehicle.

9. Sequences of instructions able to be executed by the device according to claim 5 implementing a method of generating binary signals (So1, So2, So3) out-of-phase by a control phase-difference angle (φ) continuously variable with a respect to at least one synchronization binary signal of a set of synchronization binary signals (Si1, Si2, Si3) having the same variable period (ΔTtotal), comprising the steps of:

producing rising (8) and falling (12) edges of said out-of-phase signals (So1, So2, So3) by calculating at least a level-switching delay (ΔT1) from at least rising synchronization edges (2, 3, 5, 6) or falling synchronization edges (1, 4, 7) of said synchronization binary signal (Si1, Si2, Si3) according to at least said control phase-difference angle (φ);

measuring an interval of time (ΔTpn) between two of said successive synchronization edges (1-7), one being rising and the other falling;

at least one reference edge (4, 5, 7) being chosen from said synchronization edges (1-7);

a number of said out-of-phase signals (So1, So2, So3) and a number of said synchronization signals (Si1, Si2, Si3) being equal to a predetermined number of phases;

said synchronization signals (Si1, Si2, Si3) having a duty cycle ratio equal to 0.5 and being out-of-phase with each other by a nominal phase-difference angle (Φ) in degrees equal to 360° divided by said number of phases; and calculating said delay (ΔT1) for a current synchronization binary signal (Si1, Si2, Si3) among said synchronization binary signals (Si1, Si2, Si3) with a view to producing the corresponding edge (8, 12) of the associated current out-of-phase binary signal (So1) by the following expression:

$$\Delta T1 = \Delta Tpn^*(\Delta\varphi ref - \varphi + 180)^* Np/360,$$

where:

ΔTpn is said interval of time;

φ is said control phase angle between −180° and +180°;

Δφref is the phase difference φ0−φr, expressed in degrees, between an initial edge of initial phase angle φ0 of said current synchronization binary signal and said reference edge (4, 5, 7) of reference phase angle φr of a reference synchronization binary signal chosen from the synchronization signals (Si1, Si2, Si3); and Np is equal to twice the number of phases.

10. Use of the device according to claim 5 in a control loop of a polyphase electrical machine installed on a motor vehicle.

* * * * *